(12) United States Patent
Reid et al.

(10) Patent No.: US 7,686,927 B1
(45) Date of Patent: Mar. 30, 2010

(54) METHODS AND APPARATUS FOR CONTROLLED-ANGLE WAFER POSITIONING

(75) Inventors: Jonathan D. Reid, Sherwood, OR (US); Steven T. Mayer, Lake Oswego, OR (US); Seshasayee Varadarajan, Wilsonville, OR (US); David C. Smith, Lake Oswego, OR (US); Evan E. Patton, Portland, OR (US); Dinesh S. Kalakkad, Portland, OR (US); Gary Lind, Penn Valley, CA (US); Richard S. Hill, Atherton, CA (US)

(73) Assignee: Novellus Systems, Inc., San Jose, CA (US)

( * ) Notice: Subject to any disclaimer, the term of this patent is extended or adjusted under 35 U.S.C. 154(b) by 823 days.

(21) Appl. No.: 11/510,048

(22) Filed: Aug. 25, 2006

Related U.S. Application Data

(62) Division of application No. 10/379,858, filed on Mar. 4, 2003, now Pat. No. 7,097,410, which is a division of application No. 09/872,341, filed on May 31, 2001, now Pat. No. 6,551,487.

(51) Int. Cl.
 *C25D 17/00* (2006.01)
(52) U.S. Cl. .................. 204/214; 204/199; 204/222
(58) Field of Classification Search ............... 204/119, 204/212, 214, 222, 199
 See application file for complete search history.

(56) References Cited

U.S. PATENT DOCUMENTS

| | | | |
|---|---|---|---|
| 1,225,395 A | 2/1918 | Duram | |
| 3,849,002 A | 11/1974 | Hach | |
| 4,101,919 A | 7/1978 | Ammann | |
| 4,229,191 A | 10/1980 | Moore | |
| 4,297,217 A | 10/1981 | Hines et al. | |
| 5,000,827 A | 3/1991 | Schuster et al. | |
| 5,221,449 A | 6/1993 | Colgan et al. | |
| 5,281,485 A | 1/1994 | Colgan et al. | |
| 5,482,611 A | 1/1996 | Helmer et al. | |
| 5,831,727 A | 11/1998 | Stream | |
| 5,985,762 A | 11/1999 | Geffken et al. | |
| 6,004,470 A | 12/1999 | Abril | |
| 6,074,544 A | 6/2000 | Reid et al. | |
| 6,099,702 A | 8/2000 | Reid et al. | |
| 6,099,712 A * | 8/2000 | Ritzdorf et al. | 205/123 |

(Continued)

OTHER PUBLICATIONS

U.S. Office Action mailed Jun. 6, 2005, from U.S. Appl. No. 10/379,858.

(Continued)

*Primary Examiner*—Nam X Nguyen
*Assistant Examiner*—Luan V Van
(74) *Attorney, Agent, or Firm*—Weaver Austin Villeneuve & Sampson LLP

(57) ABSTRACT

The orientation of a wafer with respect to the surface of an electrolyte is controlled during an electroplating process. The wafer is delivered to an electrolyte bath along a trajectory normal to the surface of the electrolyte. Along this trajectory, the wafer is angled before entry into the electrolyte for angled immersion. A wafer can be plated in an angled orientation or not, depending on what is optimal for a given situation. Also, in some designs, the wafer's orientation can be adjusted actively during immersion or during electroplating, providing flexibility in various electroplating scenarios.

7 Claims, 9 Drawing Sheets

U.S. PATENT DOCUMENTS

| | | | |
|---|---|---|---|
| 6,110,346 | A | 8/2000 | Reid et al. |
| 6,124,203 | A | 9/2000 | Joo et al. |
| 6,126,798 | A | 10/2000 | Reid et al. |
| 6,139,712 | A | 10/2000 | Patton et al. |
| 6,156,167 | A | 12/2000 | Patton et al. |
| 6,159,354 | A | 12/2000 | Contolini et al. |
| 6,162,344 | A | 12/2000 | Reid et al. |
| 6,179,973 | B1 | 1/2001 | Lai et al. |
| 6,179,983 | B1 | 1/2001 | Reid et al. |
| 6,193,854 | B1 | 2/2001 | Lai et al. |
| 6,217,716 | B1 | 4/2001 | Fai Lai |
| 6,221,757 | B1 | 4/2001 | Schmidbauer et al. |
| 6,251,242 | B1 | 6/2001 | Fu et al. |
| 6,261,433 | B1 | 7/2001 | Landau |
| 6,274,008 | B1 | 8/2001 | Gopalraja et al. |
| 6,277,249 | B1 | 8/2001 | Gopalraja et al. |
| 6,395,101 | B1 * | 5/2002 | Scranton et al. ............... 134/32 |
| 6,413,388 | B1 | 7/2002 | Uzoh et al. |
| 6,503,376 | B2 | 1/2003 | Toyoda et al. |
| 6,540,899 | B2 | 4/2003 | Keigler |
| 6,551,487 | B1 | 4/2003 | Reid et al. |
| 6,582,578 | B1 * | 6/2003 | Dordi et al. ................... 205/80 |
| 6,800,187 | B1 | 10/2004 | Reid et al. |
| 6,964,792 | B1 | 11/2005 | Mayer et al. |
| 7,097,410 | B1 | 8/2006 | Reid et al. |
| 2002/0029973 | A1 | 3/2002 | Maydan |
| 2002/0084183 | A1 | 7/2002 | Hanson et al. |
| 2002/0084189 | A1 | 7/2002 | Wang et al. |

OTHER PUBLICATIONS

U.S. Office Action mailed Dec. 14, 2005, from U.S. Appl. No. 10/379,858.

U.S. Office Action mailed May 15, 2003, from U.S. Appl. No. 09/927,741.

U.S. Office Action mailed Oct. 7, 2003, from U.S. Appl. No. 09/927,741.

U.S. Office Action mailed Feb. 26, 2004, from U.S. Appl. No. 09/927,741.

U.S. Office Action mailed Oct. 3, 2002, from U.S. Appl. No. 09/872,341.

U.S. Office Action mailed Feb. 20, 2004, from U.S. Appl. No. 09/927,740.

U.S. Office Action mailed Jul. 15, 2004, from U.S. Appl. No. 09/927,740.

Patton et al., "Methods and Apparatus for Bubble Removal in Wafer Wet Processing," Novellus Systems, Inc., U.S. Appl. No. 09/872,340, filed May 31, 2001, pp. 1-40.

U.S. Office Action mailed Apr. 14, 2005, from U.S. Appl. No. 09/872,340.

U.S. Office Action mailed Aug. 31, 2005, from U.S. Appl. No. 09/872,340.

U.S. Office Action mailed Jan. 18, 2006, from U.S. Appl. No. 09/872,340.

U.S. Office Action mailed May 26, 2006, from U.S. Appl. No. 09/872,340.

U.S. Office Action mailed Nov. 8, 2006, from U.S. Appl. No. 09/872,340.

* cited by examiner

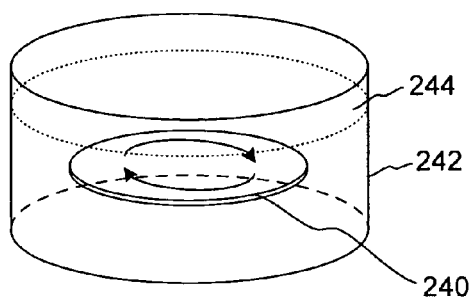 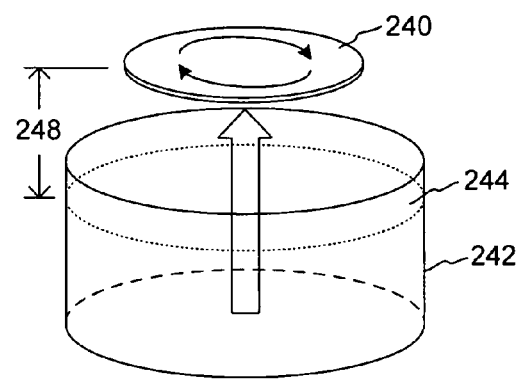
FIG. 2F　　　　　　　　FIG. 2G
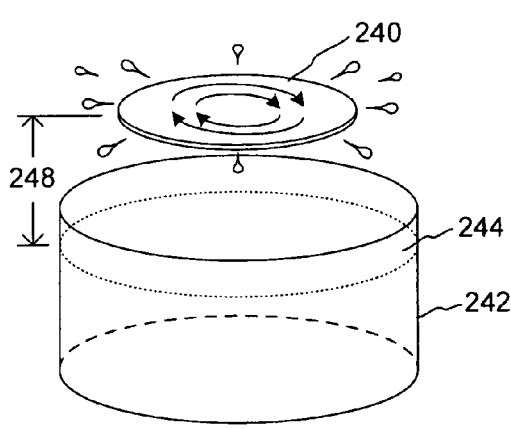 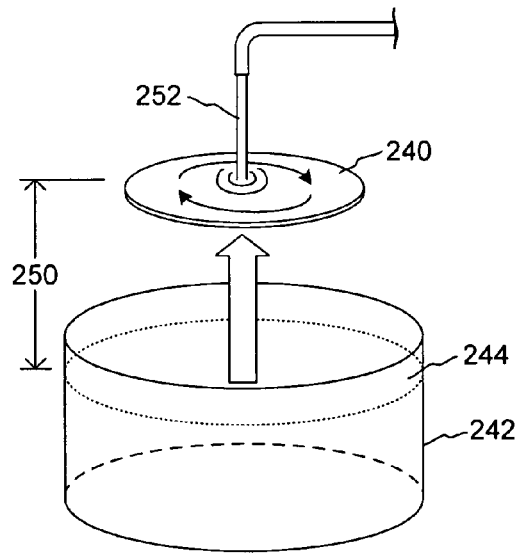
FIG. 2H　　　　　　　　FIG. 2I

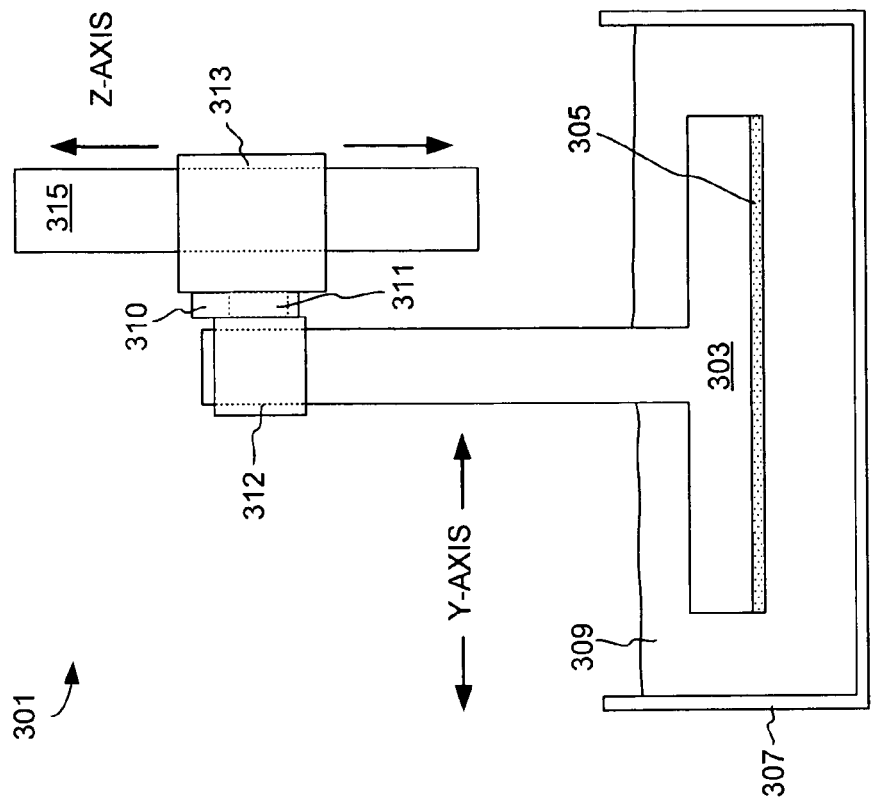
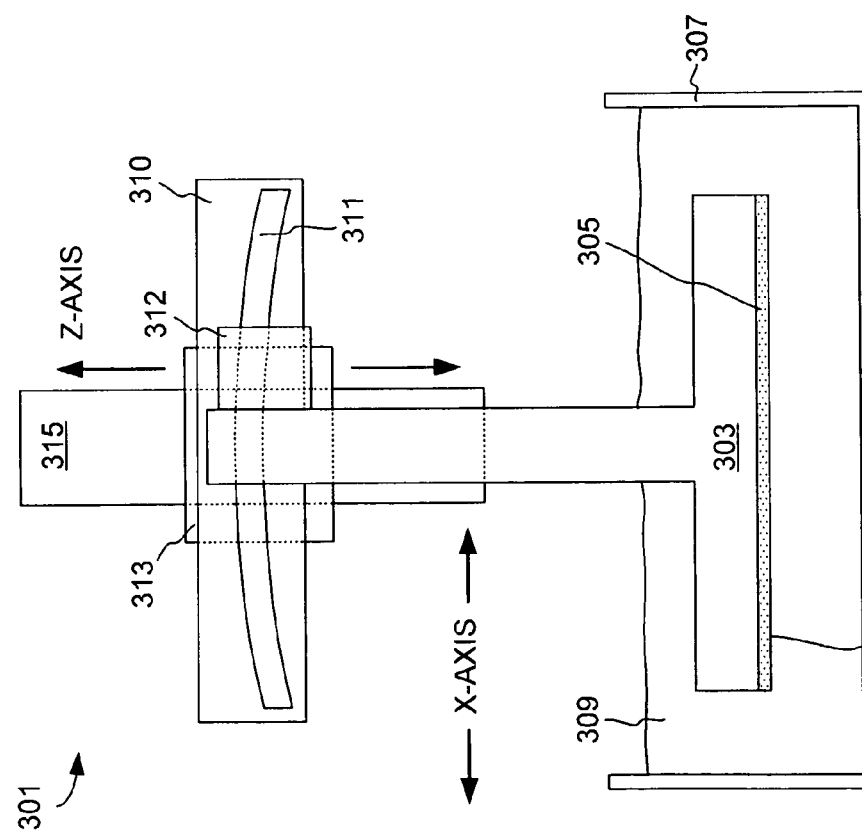
FIG. 3A
FIG. 3B

METHODS AND APPARATUS FOR
CONTROLLED-ANGLE WAFER
POSITIONING

CROSS-REFERENCE TO RELATED
APPLICATIONS

This application is a Divisional of U.S. patent application Ser. No. 10/379,858, by Reid et al., titled, "Methods and Apparatus for Controlled-Angle Wafer Positioning," (now U.S. Pat. No. 7,097,410, Issued on Aug. 29, 2006) and filed on Mar. 4, 2003 which in turn is a Divisional of U.S. patent application Ser. No. 09/872,341, filed May 31, 2001 by Reid et al., titled, "Methods and Apparatus for Controlled-Angle Wafer Immersion," (now U.S. Pat. No. 6,551,487, Issued on Apr. 22, 2003). Each of these applications is incorporated herein by reference for all purposes.

This application is related to the following US Patent Applications: U.S. patent application Ser. No. 09/927,741, naming Jonathan Reid, Steven Mayer, Marshall Stowell, and Evan Patton as inventors, titled "Improved Clamshell Apparatus for Electrochemically Treating Wafers," and filed Aug. 10, 2001; U.S. patent application Ser. No. 09/872,340, naming Evan Patton, David Smith, Jonathan Reid, and Steven Mayer as inventors, titled "Methods and Apparatus for Bubble Removal in Wafer Wet Processing," and filed May 31, 2001; and U.S. patent application Ser. No. 09/927,740, naming Steven Mayer, Marshall Stowell, Evan Patton, and Seshasayee Varadarajan as inventors, titled "Methods and Apparatus for Controlling Electrolyte Flow for Uniform Plating," and filed Aug. 10, 2001. Each of these applications is incorporated herein by reference for all purposes.

FIELD OF THE INVENTION

This invention relates to electroplating technology, such as wafer electroplating. Even more specifically, the invention pertains to methods and apparatus for controlled-angle wafer handling for the purpose of improving electroplated wafer uniformity, quality, and throughput.

BACKGROUND OF THE INVENTION

Electroplating has many applications. One very important developing application is in plating copper onto semiconductor wafers to form conductive copper lines for "wiring" individual devices of the integrated circuit. Often this electroplating process serves as a step in the damascene fabrication procedure.

A continuing issue in modern VLSI wafer electroplate processing is quality of the deposited metal film. Given that metal line widths reach into the deep sub-micron range and given that the damascene trenches often have very high aspect ratios, electroplated films must be exceedingly homogeneous (chemically and physically). They must have uniform thickness over the face of a wafer and must have consistent quality across numerous batches.

Some wafer processing apparatuses are designed to provide the necessary uniformity. One example is the clamshell apparatus available in the SABRE™ electroplating tool from Novellus Systems, Inc. of San Jose, Calif. and described in U.S. Pat. Nos. 6,156,167, 6,159,354 and 6,139,712, which are herein incorporated by reference in their entirety. The clamshell apparatus provides many advantages in addition to high wafer throughput and uniformity; such as wafer back-side protection from contamination during electroplating, wafer rotation during the electroplating process, and a relatively small footprint for wafer delivery to the electroplating bath (vertical immersion path).

There are many factors that can effect the quality of an electroplating process. Of particular note in the context of the present invention are problems having their genesis in the process of immersing the wafer into an electroplating bath. As indicated, bubbles can be entrapped on the plating underside of the wafer (the active side) upon immersion. This is especially true when the wafer is immersed in a horizontal orientation (parallel to a plane defined by the surface of the electrolyte) along a vertical immersion trajectory. Depicted in FIG. 1A is a cross-sectional diagram of a typical bubble-entrapment scenario arising in an electroplating system 101. A horizontally oriented wafer 103 is lowered towards an electrolyte 107 in a vessel 105 along a vertical Z-axis and ultimately immersed in the electrolyte. Vertical immersion of horizontally oriented wafer 103 results in air bubbles 109 being trapped on the underside (plating surface) of wafer 103.

Air bubbles trapped on the plating surface of a wafer can cause many problems. Bubbles shield a region of the plating surface of a wafer from exposure to electrolyte, and thus produce a region where plating does not occur. The resulting plating defect can manifest itself as a region of no plating or of reduced thickness, depending on the time at which the bubble became entrapped on the wafer and the length of time that it stayed entrapped there. In an inverted (face down) configuration, buoyancy forces tend to pull bubbles upwards and onto the wafer's active surface. They are difficult to remove from the wafer surface because the plating cell has no intrinsic mechanism for driving the bubbles around the wafer edges, the only path off the wafer surface. Typically, wafer 103 is rotated about an axis that passes through its center and is perpendicular to its plating surface. This also helps to dislodge bubbles through centrifugal force, but many of the smaller bubbles are tenacious in their attachment to the wafer.

Therefore, while horizontal wafer orientation (especially coupled with a vertical immersion trajectory) has numerous advantages from a hardware configuration and throughput standpoint, it leads to technically challenging issues associated with gas entrapment and consequent defect formation.

One way to facilitate removal of entrapped bubbles is to use a vertically directed electrolyte flow aimed at the plating surface of the wafer. This can help dislodge the bubbles. As depicted in FIG. 1B, scenario 102, plating solution is directed from a conduit 111 normal to the plating surface of the wafer at a velocity sufficient to dislodge entrapped bubbles. As indicated by the arrows emanating from 111, the majority of the flow is directed at the center of wafer 103. As the flow encounters the surface of the wafer, it is deflected across the wafer surface to push the bubbles toward the sides of wafer 103 as indicated by the dashed arrows. This helps remove bubbles that are not only generated upon immersion, but also those formed or reaching the surface during electroplating. Unfortunately, the radial non-uniformity of the forced convection of such systems can result in non-uniform plating profiles. This is because the electroplating rate is a function of local fluid velocity, and the forced convection of the systems such as depicted in FIG. 1B introduces non-uniform velocity profiles across the wafer surface.

Another problem associated with vertical immersion of a horizontally oriented wafer is multiple wetting fronts. When a wafer is immersed in this way, the electrolyte contacts the wafer at more than one point, creating multiple wetting fronts as the wafer is submerged in the electrolyte. Where individual wetting fronts converge, bubbles may be trapped. Also, defects in the finished plating layer can be propagated from microscopic unwetted regions formed along convergence lines of multiple wetting fronts.

What is needed therefore is a way to improve plated metal quality. Improved methods and apparatus should reduce the problems that can arise from bubble formation and multiple wetting fronts during wafer immersion.

SUMMARY OF THE INVENTION

The present invention provides methods and apparatus for controlling the orientation of a wafer with respect to the surface of an electrolyte during an electroplating process. A wafer is delivered to an electrolyte bath along a trajectory normal to the surface of the electrolyte. Along this trajectory, the wafer is angled before entry into the electrolyte for angled immersion. A wafer can be plated in an angled orientation or not, depending on what is optimal for a given situation. Also, in some designs, the wafer's orientation can be adjusted actively during immersion or during electroplating. Active angle adjustment refers to changing the angle of the wafer at any time during positioning or plating. This provides flexibility in various plating scenarios.

Stated somewhat differently, the invention provides methods and apparatus for wafer movement that embody two movements: first, moving the wafer into and out of a plating bath along a trajectory substantially normal to the surface of the electrolyte; and second, adjusting the angle of the wafer with respect to the surface of the electrolyte. These discrete movement functions are performed either concurrently or separately. Apparatus for performing the two movements have two actuators, one for each movement; therefore the movements can be separately controlled depending on the electroplating process demands. In one example, a wafer is tilted as it is immersed in a plating bath; in another example the wafer is tilted and then directed into the plating bath. In yet another example, the wafer is tilted to a new angular orientation after it is immersed in the bath at a first angular orientation.

One aspect of this invention pertains to methods of positioning a wafer during electroplating. In one preferred embodiment, a wafer is loaded and/or unloaded from an electroplating apparatus in a horizontal orientation relative to the surface of the plating bath. During electroplating, the angle of the wafer is actively changed to orientations that are optimal for reasons particular to each electroplating event. The wafer is rotated or not, depending on the desired characteristics of the plated metal film.

Of particular importance to the quality of the deposited metal film on a wafer with respect to the methods of the invention are four factors: (1) the linear speed at which the wafer is immersed and withdrawn from an electroplating bath, (2) the rotational speed of the wafer, (3) the angle of the wafer surface with respect to the electrolyte surface, and (4) the "swing speed" or angular speed upon tilting of the wafer. All of these factors (and combinations thereof) have important ramifications to the quality of the deposited metal film resulting from methods herein, as will be discussed below.

Methods of the invention utilize wafer immersion into an electrolyte along a vertical trajectory; that is, along an axis substantially normal to the electrolyte surface. Of particular importance is the speed at which this immersion (or extraction) of the wafer is performed. If the speed is too fast, then the plating process and ultimately the deposited film quality will suffer. If the speed is too slow, then throughput suffers. Preferably the speed for immersion and extraction of a wafer is between about 5 and 50 millimeters/second.

Rotation speed of a wafer is important for a number of reasons. Of particular importance is the speed of rotation during immersion and plating. If the wafer is rotated too quickly during immersion, frothing of the electrolyte can form bubbles that become entrapped on the wafer surface causing defects in the plated metal film. If the wafer is rotated too slowly, then film homogeneity may suffer. Preferably the rotational speed for immersion and extraction of a wafer is between about 50 and 150 rpm, depending on the wafer diameter. Larger diameter wafers are generally rotated more slowly than smaller diameter wafers.

The tilt angle of the wafer is important as a means to allow bubbles to escape that otherwise would become entrapped on the wafer surface. Angled immersion is important also with respect to wetting fronts formed upon immersion of the wafer into a plating bath. The preferred angle for this invention has been found to be about 5 degrees or less from horizontal.

The swing speed or angular speed upon tilting of the wafer is important for example when a wafer is already immersed in a plating solution and the tilt angle is changed. If the angle is changed too quickly, the plating solution may be splashed or agitated to a state of frothing. Again, this causes bubbles which are detrimental to the plating process and are to be avoided. Preferably, the swing speed is between about 0.25 and 3 degrees per second.

As mentioned, the invention finds particular use in the context of copper electroplating. In modern damascene processing, conditions have to be increasingly stringent for optimal plating quality and throughput. The invention provides plating environments with less possibility for defects caused by bubbles and multiple wetting fronts.

Another aspect of this invention pertains to apparatus for implementing the method of the invention. Apparatuses of the invention include one component that can tilt the wafer with respect to the surface of the electrolyte during vertical positioning in the electroplating process and another component that can translate the wafer vertically into and out of the electrolyte. This allows a wafer holder component to be tilted as well as lifted in and out of the electrolyte bath, using separate actuators for each movement component. In a preferred embodiment, one component of the apparatus has an "inverted pendulum" configuration that allows such tilting. In this embodiment, a wafer holder component is tilted by moving its distal end (the end away from the wafer) along an arced track with movement provided by a first actuator. The proximal end of the wafer holder provides a fixed pivot point at or near the wafer. The wafer holder, arced track, and first actuator form an assembly that is moved along a vertical trajectory driven by a second actuator, which provides substantially linear bi-directional movement of the wafer into or out of an electrolyte bath.

These and other features and advantages of the present invention will be described in more detail below with reference to the associated figures.

BRIEF DESCRIPTION OF THE DRAWINGS

The following detailed description can be more fully understood when considered in conjunction with the drawings in which:

FIGS. 2B-2I are schematic illustrations of an electroplating cell and wafer at various stages in the process depicted in FIG. 2A.

FIG. 3A is a simplified block diagram of a front view of a wafer positioning apparatus of the invention.

FIG. 3B is a simplified block diagram of a side view of a wafer positioning apparatus of the invention.

DETAILED DESCRIPTION OF THE PREFERRED EMBODIMENTS

In the following detailed description of the present invention, a few specific embodiments are set forth in order to provide a thorough understanding of the invention. However, as will be apparent to those skilled in the art, the present invention may be practiced without these specific details or by using alternate elements or processes. In some descriptions herein, well-known processes, procedures, and components have not been described in detail so as not to unnecessarily obscure aspects of the present invention.

A central aspect of the invention pertains to methods of positioning a wafer relative to a plane defined by the surface of an electrolyte in an electroplating apparatus. Generally, the positioning involves two operations: (1) moving the wafer into or out of the electrolyte along a trajectory substantially normal to the plane defined by the surface of the electrolyte, and (2) adjusting the angle defined by the relative position of a planar plating surface of the wafer with respect to the plane. See FIGS. 3D and 3E, for example. In many embodiments, the angle adjustment takes place while the wafer's angular pivot point is itself stationary or moving linearly along the trajectory normal to the plane defined by the surface of the electrolyte. This positioning method provides angle control during immersion and plating, if necessary. The movements of translating the wafer vertically into or out of the electrolyte and adjusting the angle of the wafer can be performed either concurrently or in each in separate time frames.

In one specific embodiment, the immersion process is performed in a particular sequence as set forth now and described in more detail below with respect to FIG. 2. This sequence involves first positioning the wafer horizontally, such that a planar plating surface of the wafer is substantially parallel to a plane defined by the surface of the electrolyte. In many designs, the wafer starts at a position above the electroplating cell. Then the wafer is tilted at an angle such that the planar plating surface of the wafer is no longer substantially parallel to the plane defined by the surface of the electrolyte. The tilting generally takes place with the wafer positioned above the electrolyte. Either after the tilting or concurrently with the tilting, the wafer is moved toward the electrolyte along a trajectory substantially normal to the plane defined by the surface of the electrolyte. Finally, the wafer is immersed in the electrolyte while the wafer is tilted.

Figure 1A:
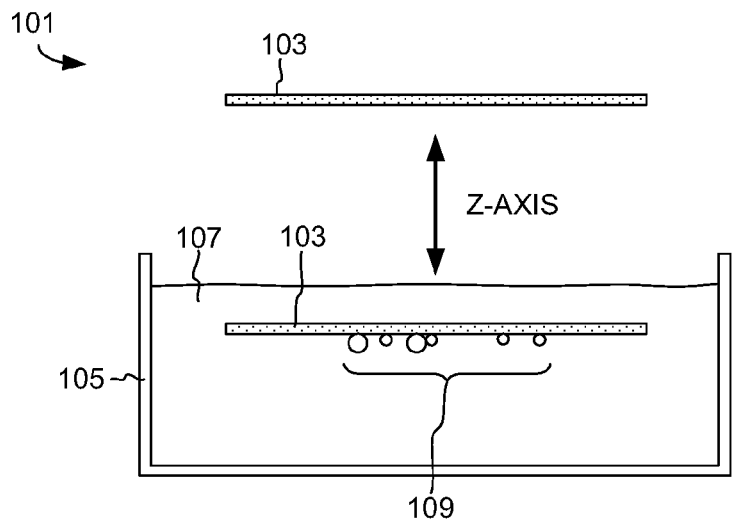
FIG. 1A is a cross-sectional diagram of a typical bubble-entrapment scenario.
Figure 1B:
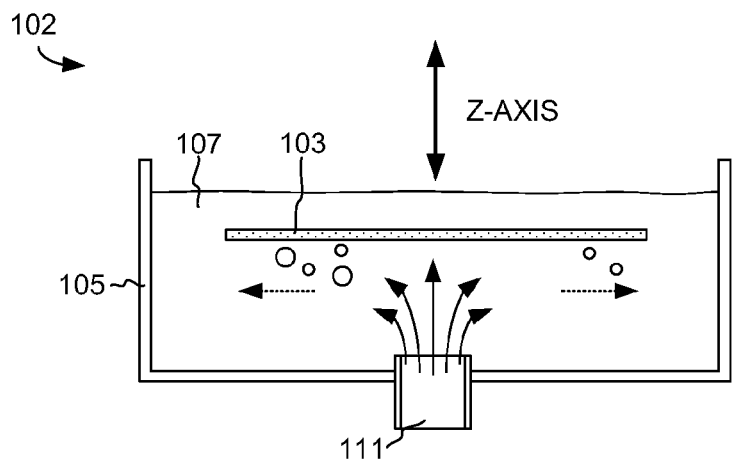
FIG. 1B is a cross-sectional diagram of a bubble removal scenario employing axially-directed electrolyte flow.
Figure 1C:
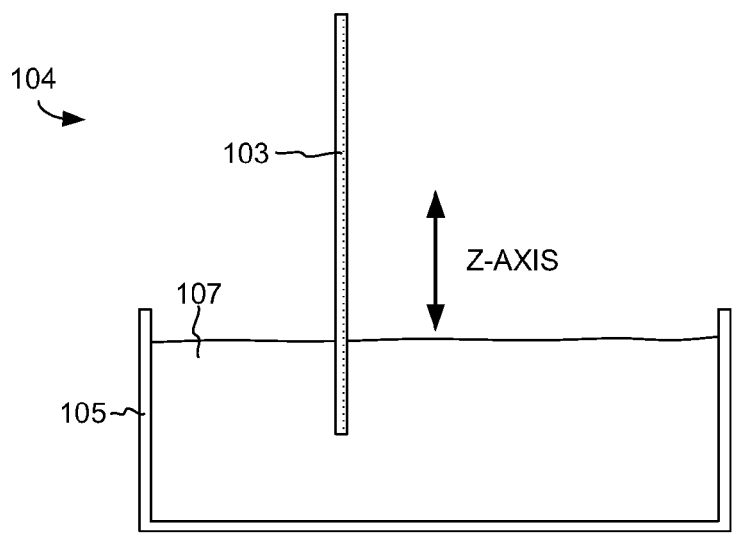
FIG. 1C is a cross-sectional diagram of a wafer having a vertical orientation (normal to a plane defined by the surface of an electrolyte) along a vertical immersion path (z-axis).

In this method, the wafer's angular orientations may deviate from the horizontal quite significantly (in the extreme example up to about 90 degrees), as depicted in FIG. 1C. In scenario 104, any bubbles formed upon immersion of wafer 103 in electrolyte 107 will naturally rise along the face of the wafer and escape to the atmosphere. Thus, this vertical immersion scenario is ideal for avoiding bubble entrapment and multiple wetting fronts. Preferably, however, the orientations deviate relatively little; e.g., by not more than about 20 degrees. In many embodiments of interest, the angular orientation deviates from the electrolyte plane by about 5 degrees or less. In one specific embodiment, the wafer does not vary by more than between about 4 and 5 degrees from horizontal.

By using a relatively small angle of tilt, deviation from a smaller footprint is lessened because components of apparatus designed to implement the method need not project much beyond the area of the plating bath if at all. Plating baths need not be made any deeper or wider to accommodate apparatus designed to implement the method, and thus there is no need for additional expense for increased electrolyte volume.

Moving the wafer toward the electrolyte as described preferably occurs at a speed between about 5 and 50 millimeters/second. More preferably moving the wafer toward the electrolyte occurs at a speed between about 5 and 25 millimeters/second. Even more preferably moving the wafer toward the electrolyte occurs at a speed between about 8 and 15 millimeters/second. Most preferably moving the wafer toward the electrolyte occurs at a speed of about 12 millimeters/second. The wafer enters the electrolyte at these speeds, in an angled orientation. The tilting operation may be accomplished while the wafer is moving at these speeds. Since the movement of the wafer into the electrolyte at the above speeds takes place along a direction substantially normal to the plane of the electrolyte surface, the speed is sometimes referred to as "z-speed." Note that the z-direction translation need not be absolutely vertical or normal to the plane of the plane of the electrolyte. Given design tolerances and apparatus constraints, the trajectory may vary from the absolute normal by a slight amount; e.g., a few degrees. The concept of "substantially normal" encompasses the "absolute normal."

Some or all of the operations described above may be performed while the wafer is rotating about an axis normal to the plating surface of the wafer. For many operations, the wafer is rotated at a speed of between about 1 and 150 rpm. The rotational speed will vary depending upon the operation. For electroplating, the wafer is preferably rotated at a speed of between about 100 and 150 rpm when the wafer is about 200 mm in diameter. And, the wafer is preferably rotated at a speed between about 50 and 100 rpm when the wafer is about 300 mm in diameter. More preferably, wafers of about 300 mm are rotated at a speed of about 90 rpm. Other operations for which rotation may be appropriate include immersion (to facilitate wetting), spinning off excess electrolyte after the wafer is removed from the electrolyte cell, and rinsing the wafer. Each of these operations may have their own optimal range of rotation speeds.

Also optionally, the method includes adjusting the angle of the wafer's planar plating surface with respect to the plane defined by the surface of the electrolyte while the wafer is stationary with respect to a direction normal to the plane defined by the surface of the electrolyte or while the wafer is translating linearly in a trajectory normal to that plane. In a particular embodiment, tilting is performed while the wafer is stationary with respect to the direction normal to the plane defined by the surface of the electrolyte. Adjustment may occur after the wafer is immersed in the electrolyte. In such cases, the wafer assumes one angular orientation during immersion and a different angular orientation during plating. Using the methods and apparatus of this invention, one can control the angular orientation of the wafer at various stages of the actual plating operation.

As should be clear, the invention allows separate control of z-direction translation and angular tilting of the wafer. Preferably, though not necessarily, the wafer is tilted during entry into the electrolyte. The appropriate level of tilting for immersion may be accomplished at various points in the overall process. While the discussion above generally assumes that the tilting occurs prior to z-direction translation, this need not be the case. In one embodiment, the wafer is first positioned horizontally above the electrolyte as described above. Then the wafer is moved toward the electrolyte along a trajectory normal to the plane defined by the surface of the electrolyte. At least initially in this process, the wafer is oriented horizontally. Next, the wafer is tilted at an angle such that the planar plating surface of the wafer is no longer substantially parallel to the plane defined by the surface of the electrolyte. And finally, the wafer is immersed into the electrolyte while the wafer is tilted.

As explained, angled immersion is important for avoiding entrapment of bubbles on the plating surface formed during electroplating. And as explained, methods can be performed with "active angle adjustment"; that is, independent control of the angle of the wafer before, during, and/or after immersion in the plating bath. At any one or more wafer positions during processing, the wafer may be tilted independently over a range of angles. Preferably, such tilting is permitted while the wafer center (or its pivot point) is stationary in three-dimensional space or moving along a defined trajectory during immersion into or removal from the electroplating bath. Note that is not possible for wafers that are rigidly affixed to an arm that "swings" the wafer into a plating solution.

In one embodiment of the aforementioned positioning method, the pivot is a "virtual" pivot. By "virtual" we mean that the wafer pivot point is not defined by a hinge or other mechanical pivot mechanism. The pivot point is not at the location of a pivoting mechanical mechanism. Rather, the wafer pivots by virtue of separate mechanism located remote from the pivot point. Of course, the invention encompasses actual mechanical pivots as well as virtual pivots. One example of a virtual pivot is provided by a mechanism in which a wafer holder has an inverted pendulum design. In this design, movement of a part of the wafer holder located distally from the wafer actually causes the wafer to pivot upon an axis passing through a plane near and parallel to, or passing through the wafer. This will be explained in more detail below.

A more encompassing aspect of the invention pertains to methods of electroplating a wafer comprising positioning the wafer horizontally at a first height above an electrolyte, wherein a planar plating surface of the wafer faces and is parallel to a plane defined by the surface of the electrolyte. Then the wafer is tilted at an angle such that the planar plating surface of the wafer is no longer parallel to the plane defined by the surface of the electrolyte. The wafer is then rotated along a first axis normal to the planar plating surface of the wafer and which passes through the center of the wafer, at a first rotational speed. Next, the wafer is moved into the electrolyte along a trajectory substantially normal to the plane defined by the surface of the electrolyte. Then the wafer is electroplated on its plating surface with a metal, and removed from the electrolyte along the trajectory to a second height, below the first height, above the electrolyte.

In one embodiment, this method further comprises decreasing rotation rate from the first rotational speed to a second rotational speed prior to removing the wafer from the electrolyte.

In another embodiment, this method further comprises, after removing the wafer from the electrolyte, returning the wafer to horizontal, rotating the wafer at a third rotational speed, faster than the first rotational speed; in order to remove and reclaim a portion of the electrolyte remaining on the wafer. Then the wafer is raised to a third height between the first and second height above the electrolyte. Finally the wafer is rinsed with a rinsing medium, spin-dried; and raised to the first height. In a specific embodiment, returning the wafer to horizontal takes place at the second height.

As mentioned above, the following parameters may be important to the performance of the plating process: the linear speed at which the wafer is immersed and withdrawn from an electroplating bath, the rotational speed of the wafer, the angle of the wafer surface with respect to the electrolyte surface, and the "swing speed" or angular speed upon tilting of the wafer. The operations associated with these parameters may be performed in various sequences. A specific example, method 201, of electroplating a wafer with active angle positioning will now be described with reference to the flow chart of FIG. 2A and associated schematic diagrams in FIGS. 2B-2I. Note that the invention may employ any combination of the process operations depicted in FIGS. 2A-2I. In many embodiments, some fraction of the depicted process operations will not be performed.

Method 201 is described with an electroplating apparatus in mind, although any wet wafer processing would apply wherein the wafer is immersed into a bath of processing solution. Preferably copper is electroplated onto the wafer. First, a wafer 240 is loaded into an electroplating apparatus wafer holder (not shown), in a horizontal orientation at a first height 246. See 203. This orientation is commonly employed in wafer handling apparatus including robots for transferring wafers from one piece of apparatus to the next. The wafer can be loaded and unloaded from associated plating hardware in a horizontal orientation at the first height. The first height can vary, depending on the hardware used to implement the method. Typically, the wafer's initial position (shown in FIG. 2B) is above the electrolyte such that electroplating takes place directly under this starting position.

Figure 2A:
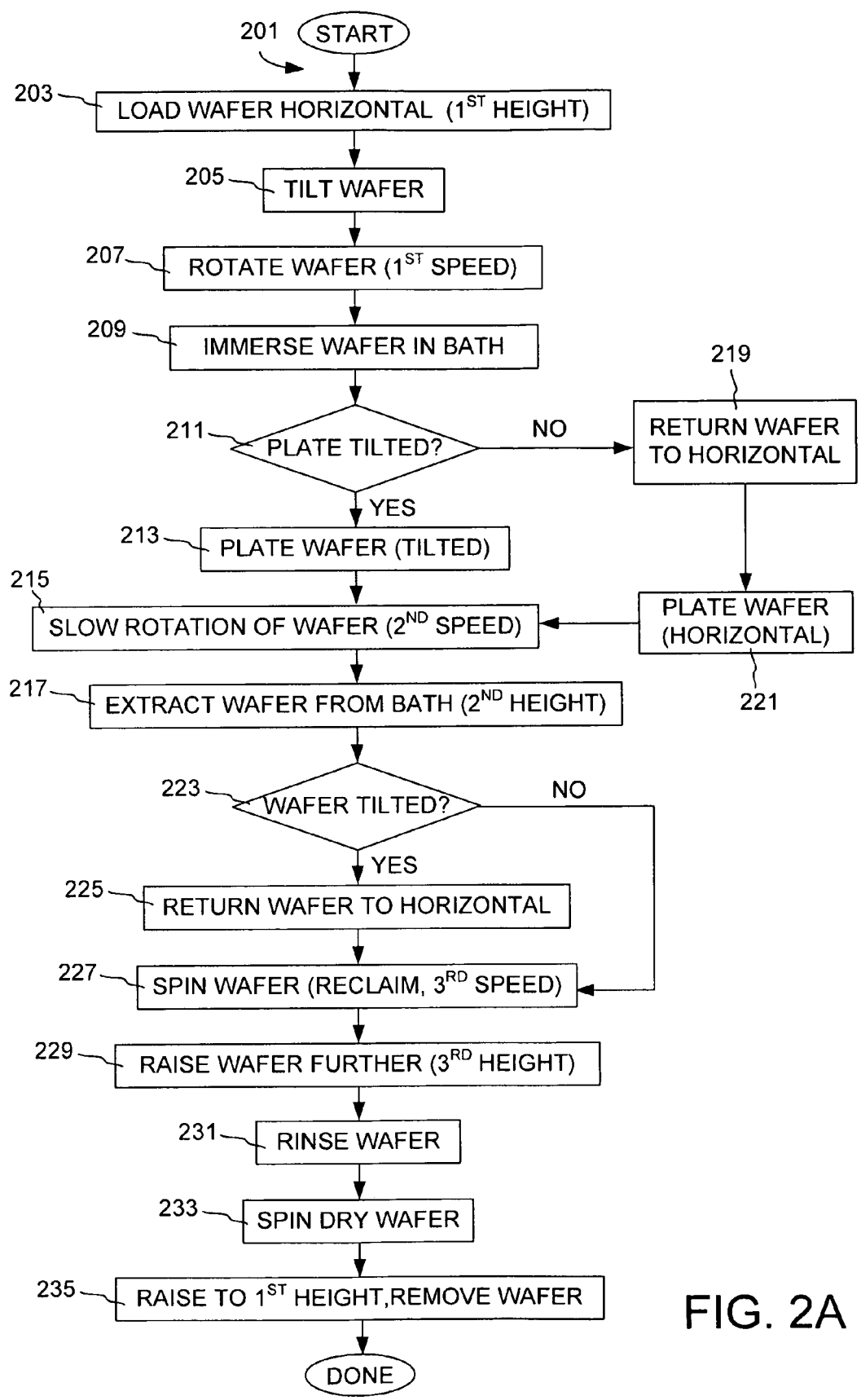
FIG. 2A is a detailed flowchart of a preferred embodiment of the method of electroplating a wafer with active angle positioning.
Figure 2B:
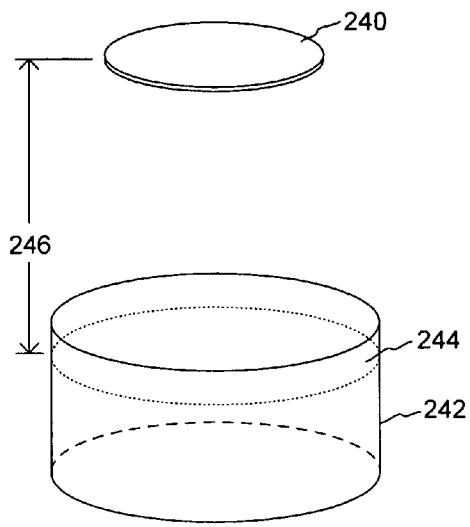
Figure 2C:
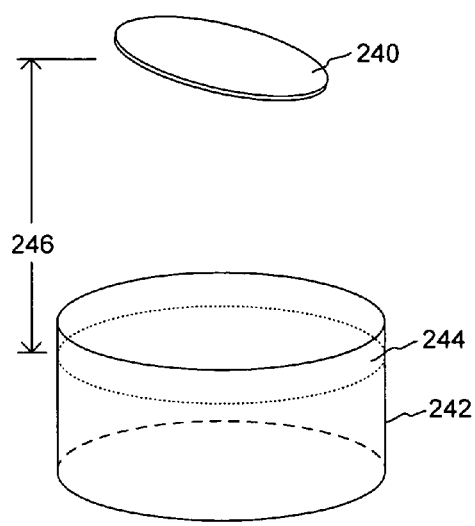
Figure 2D:
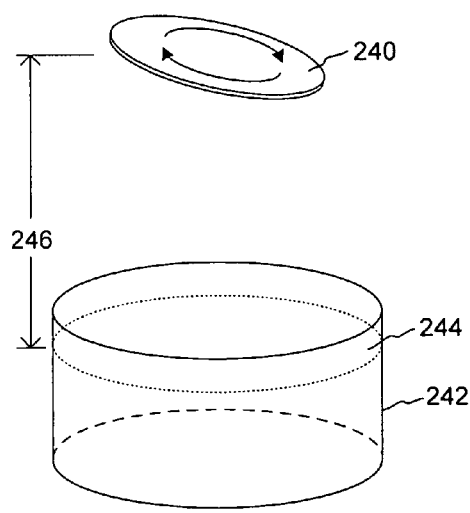
Figure 2E:
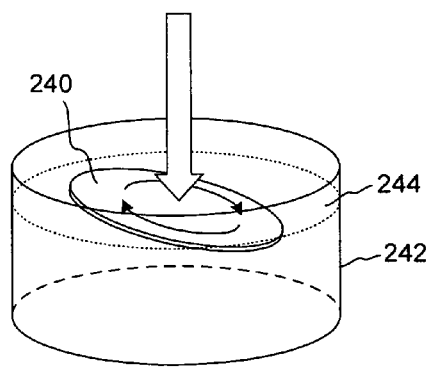

Since many wafer processing tools require horizontal orientation of wafers, this facilitates wafer throughput via integration with other tools; that is, wafers need not be re-oriented before loading into a tool utilizing this method or before loading into another wafer processing tool after unloading from a tool utilizing this method. In the broadest sense however, the invention embodies methods and apparatus wherein the wafer's starting position is not horizontal (but rather as depicted in FIG. 2C). Also, handling a wafer along a vertical trajectory allows associated apparatus implementing the method to be designed with a smaller relative footprint than those requiring delivery of a wafer to a plating bath from positions not above the electrolyte.

Next the wafer 240 is tilted. See FIG. 2C and block 205 of FIG. 2A. This allows immersion of the wafer at an angle and thereby reduces the aforementioned wetting and bubble problems. Specifically, angled immersion reduces the problems of bubble entrapment on the plating surface and multiple wetting fronts. Depending on the electroplating event taking place and the details of the wafer holding apparatus (clamshell), optimally, different angles may be used. Note that electroplating at an angle helps prevent entrapment of bubbles on the plating surface during electroplating. Defects in the plated film are reduced when angled plating is employed. In operation 205, the angle of the wafer is preferably about 5 degrees or less. In a very specific embodiment, the angle is about 4.6 degrees.

Next the wafer is optionally rotated at a first rotational speed. See FIG. 2D and block 207 of FIG. 2A. As mentioned if wafer rotation and immersion rate (z speed) is properly controlled, multiple wetting fronts and bubble formation (frothing) during immersion can be minimized. As mentioned above, different rotational speeds may be employed for different operations. For immersing the wafer, the rotational speed is preferably between about 1 and 150 rpm. For a 200 mm diameter wafer, the speed is preferably between about 100 and 150 rpm. For a 300 mm diameter wafer, the speed is preferably between about 50 and 100 rpm, more preferably about 70 rpm.

The wafer is then immersed in the bath. See FIG. 2E and block 209 of FIG. 2A. For the reasons described above, preferably the wafer is moved into electrolyte 244 (in an electroplating cell 242) at a speed of between about 5 and 50 millimeters/second. More preferably, at a speed of between about 5 and 25 millimeters/second. Even more preferably, at a speed of between about 8 and 15 millimeters/second. Most preferably, at a speed of about 12 millimeters/second.

Next the process flow accounts for the options of plating horizontally or at angled orientation. See 211. If the operation is to be conducted while tilted, then electroplating, preferably with copper, is done at a specified angle. If not, then the wafer orientation is returned to horizontal while in the electroplating cell 242. See FIG. 2F and block 219 of FIG. 2A. This allows flexibility for plating environments that do not accommodate a tilted wafer for plating or in cases where horizontal plating is preferred. In this embodiment, the angular speed or "swing speed" of the wafer may be important. Since the wafer is rotating relatively fast, if the wafer is tilted back to horizontal too quickly, then too much turbulence may result and create bubbles or splashing (and possibly contamination of equipment with splashed electrolyte). As with all events in a high throughput environment, if the swing speed is too slow, throughput suffers. Preferably, the swing speed of the wafer is between about 0.25 and 3 degrees per second. More preferably, the swing speed is between about 0.25 and 1.5 degrees per second. Most preferably, the swing speed is between about 0.5 and 1 degrees per second. As well, any entrapped bubbles must be given time to escape while the wafer is still tilted. Thus a delay is sometimes used before the wafer is returned to a horizontal orientation. The delay time is preferably between about 1 and 20 seconds. More preferably the delay time is 2 to 10 seconds. Most preferably the delay time is about 5 seconds. Once the wafer is oriented horizontally at 219, then it is plated in that orientation. See FIG. 2F and block 221 of FIG. 2A.

Referring back to block 211, if the wafer is to be plated in a tilted orientation, then the plating is conducted at 213. Once the wafer is fully electroplated, either in 211 or 213, its rotation is slowed from the first rotational speed to a second rotational speed (see 215) before being extracted from the bath. It can be important to slow the rotation so that when the wafer is extracted from the bath, splashing and/or frothing are minimized. It has been found that splashing or frothing can leave surface bubbles in the bath, which can become attached to the subsequently plated wafer. Slowing rotation also minimizes vortexing. If a significant vortex is formed in the electrolyte from the rotational drag on the electrolyte surface during wafer extraction, then the resultant turbulence on the electrolyte surface can detrimentally effect wetting of the next wafer. Preferably, the second rotational speed is between about 25 and 75 rpm. More preferably, between about 10 and 50 rpm.

After its rotation is slowed, the wafer is extracted from the electrolyte. See FIG. 2G and block 217 of FIG. 2A. Also, in conjunction with slowing to a second rotational speed, the wafer extraction may be done at a vertical linear speed (z-speed) that is the same as or less than that used for immersion. Preferably, extracting the wafer from the electrolyte is performed at a speed between about 5 and 25 millimeters/second. More preferably, extracting the wafer from the electrolyte is performed at a speed of about 12 millimeters/second. The wafer is elevated to a second height 248, below the first height, about 30 millimeters above the electrolyte.

At this point, the process flow 201 (FIG. 2A) shows decision 223. If the wafer is not already horizontal, then it is returned to horizontal. See 225. If the wafer is horizontal, then 225 is skipped. The next event is a reclaim. See FIG. 2H and block 227 of FIG. 2A. Still at the second height, the wafer's rotation is increased to a third rotational speed, faster than the first rotational speed, in order to remove and reclaim a portion of the electrolyte remaining on the wafer. Centrifugal force throws the electrolyte from the wafer and it is collected for reclaim in a receptacle (not shown). Preferably, the third rotational speed is between about 200 and 600. More preferably, the third rotational speed is about 400 rpm.

Next, the wafer is raised to a third height 250, between the first and second heights. See FIG. 2I and block 229 of FIG. 2A. This is done in order to rinse any remaining electrolyte from the wafer surface. Ultra-pure deionized water or other appropriate cleaning fluid may be used to rinse the wafer, see 231. Preferably, rinsing the wafer comprises contacting the wafer with a steady stream of cleaning fluid 252 near the center of the wafer at a flow rate of between about 100 and 500 ml/minute for between about 1 and 2 seconds. Using a distinct, third height allows reclaim of the rinse fluid in a separate reclaim apparatus since the rinse water (as does the electrolyte in its reclaim) sprays in a relatively tight band radially outward from the wafer, when the wafer is rotating at the third rotational speed. Reclaim channels are effective components of plating chambers to implement such a reclaim scenario. A good example of such a chamber is described in U.S. Pat. No. 6,099,702 by Reid, et al, which is incorporated by reference herein. Preferably, the third height is about 100 millimeters above the electrolyte. The wafer is then spin dried at the third height, see 233. Preferably, the spin dry is between about 1 and 2 seconds.

Finally, the wafer is returned to the first height and removed. See FIG. 2B and block 235 of FIG. 2A. As described above, the wafer having been returned to its original starting point facilitates equipment designed to implement the method in coordinating with other wafer processing equipment, especially robot handlers, thus increasing throughput.

In one example, the second height is about 30 millimeters above electrolyte 244 and the third height is about 100 millimeters above the electrolyte. The first height (the starting or load location height) is about 200 mm above the electrolyte. This invention also pertains to apparatus that facilitate angled immersion of the wafers into electroplating baths. Such apparatus should allow the flat active surface of a wafer to assume multiple angles with respect to the electrolyte surface. These angles represent deviations from the horizontal wafer orientation in which its active surface is parallel to the plane of the electrolyte surface. In other words, the apparatus should allow the wafer to tilt about a pivot location on or near the wafer. Preferably, the apparatus accomplishes this without significantly varying the wafer's overall position in three-dimensional Cartesian space. In other words, the apparatus should be able to tilt the wafer's angle with respect to a plane parallel to the electrolyte's surface, without significantly translating the wafer. More specifically, some point or line on or near the wafer remains stationary during such pivoting. For example, the wafer's pivot point or its center point may remain fixed during pivoting.

Obviously, the apparatus should permit the full range of operations associated with electroplating. Thus, for example, the apparatus should permit and/or drive movement of the wafer into and out of the electrolyte bath. Preferably, though not necessarily, this is accomplished via a linear trajectory—along a path substantially normal to the surface of the electrolyte. In addition, the apparatus should allow and/or drive rotation of the wafer about an axis through the center of its flat active surface. Parameters that may be controllable with apparatus of this invention include the speed at which the wafer is rotated, the swing speed at which the wafer is tilted over a range of angles, the total range of angles over which the wafer is tilted, the speed at which the wafer is translated into and out of the electrolyte, and the like.

Apparatus suitable for use with this invention can take on many different forms. It may include a variety of drive mechanisms, holders, pivot devices, and structural members. Generally, there will be a drive mechanism for controlling the rotation of the wafer. There may be one or more other drive mechanisms that control tilting of the wafer and translation of the wafer. These drive mechanisms may be of many different types such as hydraulic actuators, electric motors, screw drives, and the like. Various wafer holders and tracks for moving the wafer holders may also be employed.

In one approach, wafer tilting is accomplished by an apparatus that holds the wafer at a proximate end of a longitudinal member. The apparatus maintains this end of the longitudinal member at a substantially constant position in three-dimensional Cartesian space. The distal end of the longitudinal member is allowed to move over an arced path. This causes the wafer to tilt as described above. As illustrated in FIGS. 3A-3D described below, the longitudinal member may take the form of a wafer holder in an "inverted pendulum" orientation.

A simplified block diagram depicting a front view of a wafer positioning apparatus, 301, of this approach is depicted in FIG. 3A. Apparatus 301 has a wafer holder 303. Wafer holder 303 has a proximal end that engages a wafer 305, and a distal end movably connected to an arced track 311 via an actuator 312. This arrangement is more easily visualized in conjunction with FIG. 3B, which depicts a block diagram of a side view of wafer positioning apparatus 301. Wafer holder 303 is immovably coupled to actuator 312. Also, wafer holder 303 rotates wafer 305 about an axis normal to the wafer planar plating surface 319. The components of 303 responsible for driving wafer rotation are not depicted. The proximal end of wafer holder 303 is depicted as immersed in electrolyte 309 of an electroplating cell 307 (anode components not depicted).

In this case, arced track 311 can be integral to plate 310 or attached to plate 310. For example, arced track 311 can be a groove, channel, or race formed in plate 310, a curved track or support along which actuator 312 travels, or a curved surface upon which actuator 312 rolls or slides, etc. Arced track 311 could be simple a curved rail, without a support structure (e.g., plate 310), that is, directly attached to actuator 313. Thus an "arced track" is any assembly that provides an arced trajectory to the distal end of the wafer holder having the inverted pendulum design, thus tilting the proximal end (and wafer) upon a virtual pivot.

Actuator 312 moves the distal end of wafer holder 303 along arced track 311. Plate 310 is immovably coupled to a second actuator 313. Actuator 313 is movably coupled to a shaft 315, and moves bi-directionally along fixed shaft 315 as indicated by the Z-axis arrows, thereby moving plate 310, actuator 312, and wafer holder 303 along with it. In this embodiment, there is component movement along the Z-axis and the X-axis, but none along the Y-axis. Thus, the assembly comprising wafer holder 303, actuator 312, plate 310, and actuator 313 moves along a vertical path (Z-axis) above the electrolyte and by this action, wafer 305 is moved into and out of electrolyte 309.

Figure 3D:
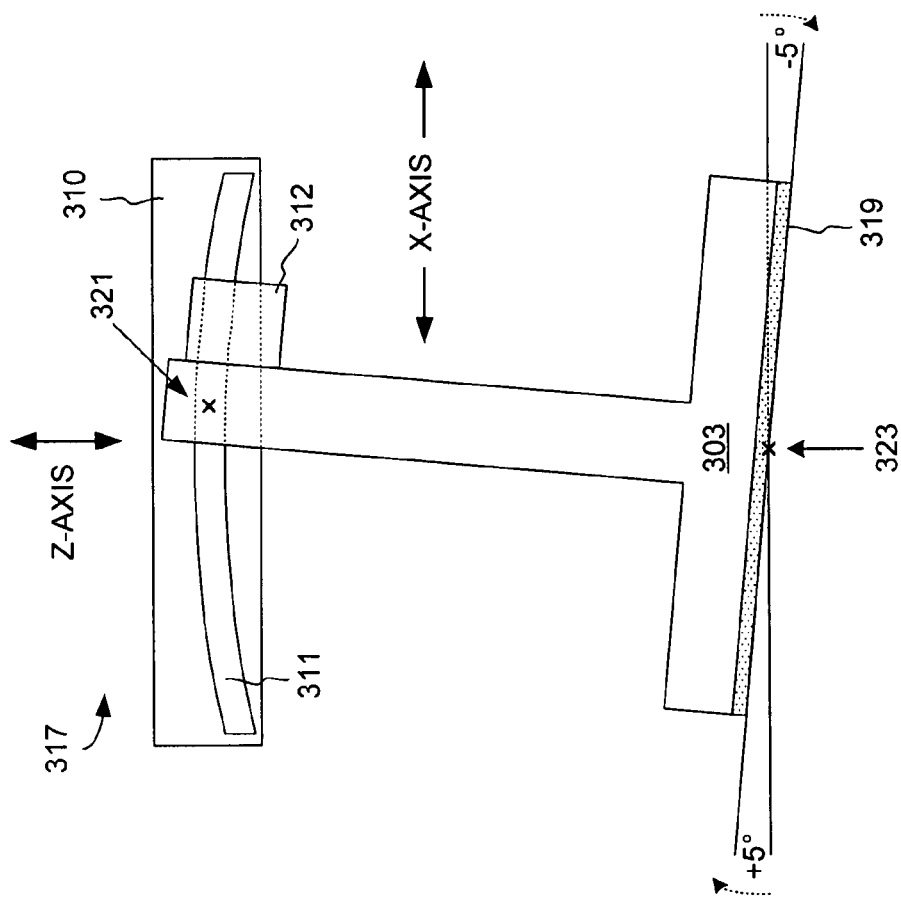
FIGS. 3C-E are block diagrams as in FIG. 3A and depicting movement of the wafer positioning apparatus.
Figure 3C:
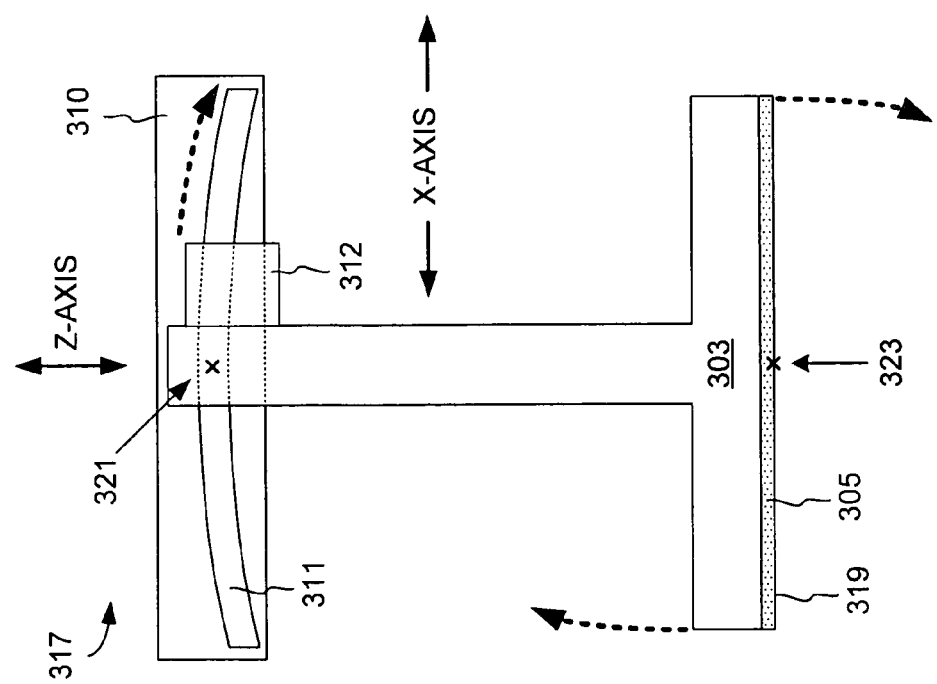

Depicted in FIG. 3C is cross-sectional block diagram depicting a front view of a movement scenario of an assembly 317 of wafer positioning apparatus 301 depicted in FIG. 3A and FIG. 3B. Assembly 317 comprises wafer holder 303, actuator 312, and plate 310. The distal end of wafer holder 303 is movably coupled to arced track 311 via actuator 312. For this discussion, a point 321 on the distal end of wafer holder 303 traces an arced path along 311 as the distal end is moved along arced track 311 by actuator 312. As indicated by the dashed arrows, as the distal end of the wafer holder is moved along the arced path, the proximal end of 303 is tilted from horizontal. Thus wafer 305 is tilted on a virtual pivot 323. Pivot 323 is "virtual" in that it lacks an associated physical pivot joint or hinge.

Referring to FIG. 3D, when point 321 is moved from its position in FIG. 3C to a new position as depicted, wafer 305 (drawn with reference to its surface 319) is tilted from horizontal upon virtual pivot 323. Described only for reference to movement about pivot 323, half of wafer 305 is tilted 5 degrees above horizontal and half is tilted 5 degrees below horizontal. Thus, with respect to a plane defined by the surface of an electrolyte in a plating bath, wafer 305 is tilted 5 degrees from horizontal.

Figure 3E:
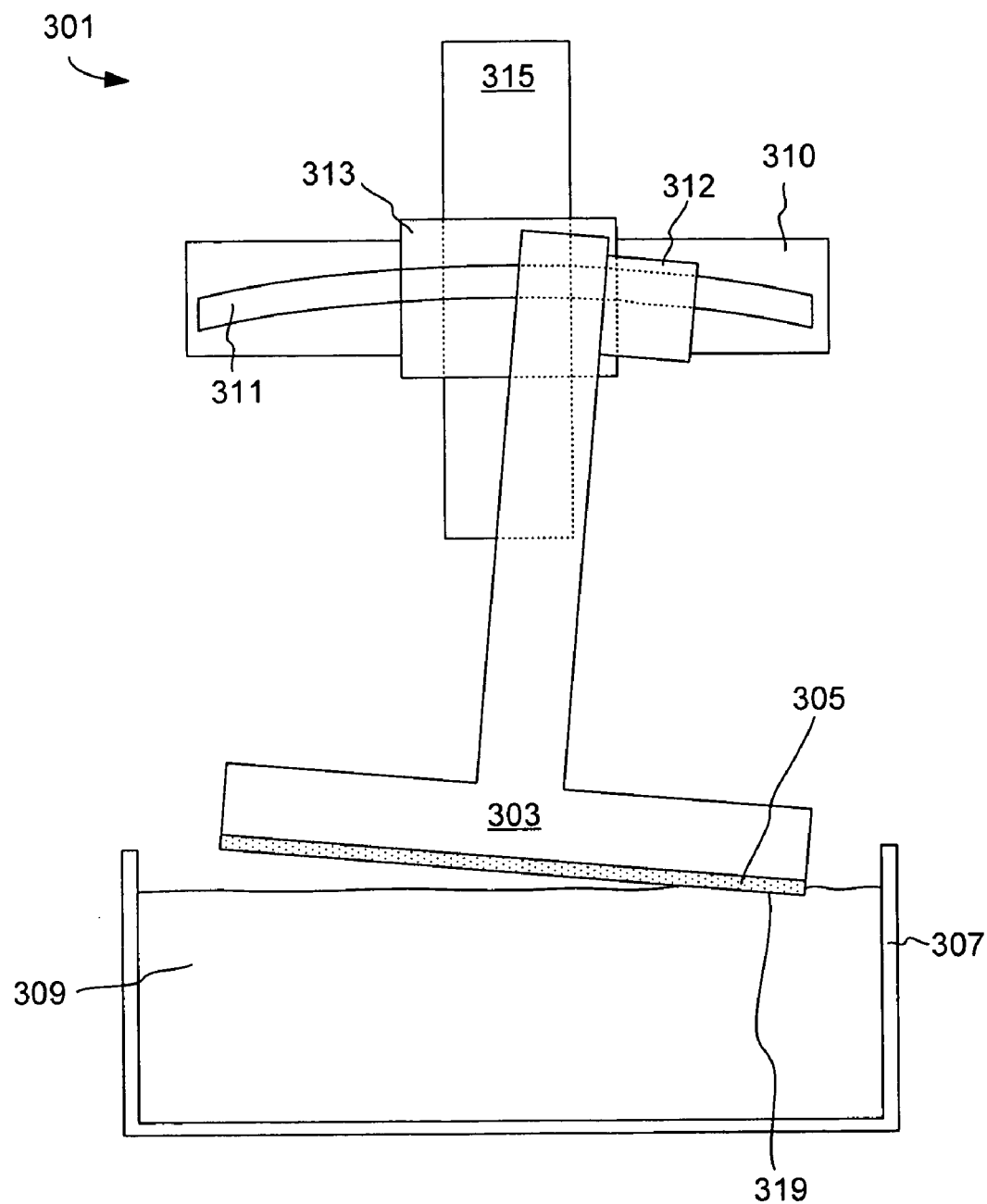

FIG. 3E depicts angled immersion of the wafer 305 using apparatus 301. Apparatus 301 moves a wafer along an axis normal to the surface of an electrolyte and tilts the wafer from horizontal, allowing for angled immersion and angled plating. The use of a virtual pivot is one embodiment of the tilting capability of the invention. Other embodiments may use actual pivot joints located in the vicinity of the wafer. Importantly, the apparatus provides two distinct movement capabilities: vertical movement along a vertical trajectory normal to the electrolyte and a tilting movement of the wafer.

The apparatus of this invention should provide wafer movement at speeds appropriate for embodiments of the invention. Preferably, rotational drive components of apparatus 301 can provide a wide range of rotational speeds for wafer holder 303. In one embodiment, it can rotate a wafer at a speed of between about 1 and 600 rpm. In one embodiment, actuator 313 provides linear bi-directional movement at a speed of between 0 and about 25 millimeters/second. Movement of the distal end of the wafer holder along the arced track is provided by a hydraulic cylinder, although other suitable means can be used such as gears, lead screws, and the like. As explained, movement of the distal end of wafer holder 303 along arced track 311 provides tilting of the planar plating surface 319 of wafer 305 from a horizontal position, parallel to the plane defined by the surface of the electrolyte, at an angle such that the planar plating surface of the wafer is no longer parallel to the plane defined by the surface of the electrolyte. Preferably, apparatus 301 can provide tilt at angles of between 0 degrees and at least about 5 degrees. Most preferably, the angle can be actively adjusted during any electroplating operation. As mentioned, the planar plating surface 319 of wafer 305 is tilted at a specific swing speed, in instances when a wafer need be returned to a horizontal position after immersion. Preferably, apparatus 301 can provide a swing speed of the wafer between about 0.25 and 3 degrees per second. More preferably, the swing speed is between about 0.25 and 1.5 degrees per second. Most preferably, the swing speed is between about 0.5 and 1 degrees per second.

Although other wafer holder components can be used for the invention, a good example of a wafer holder is the clamshell apparatus as referenced above in the background section and described in U.S. Pat. Nos. 6,156,167 and 6,139,712. If a clamshell is used as the wafer holder component of the apparatus, the other components essentially comprise positioning elements for the clamshell, since the clamshell has necessary electrical contacts, holding and rotational components, etc.

Figure 4A:
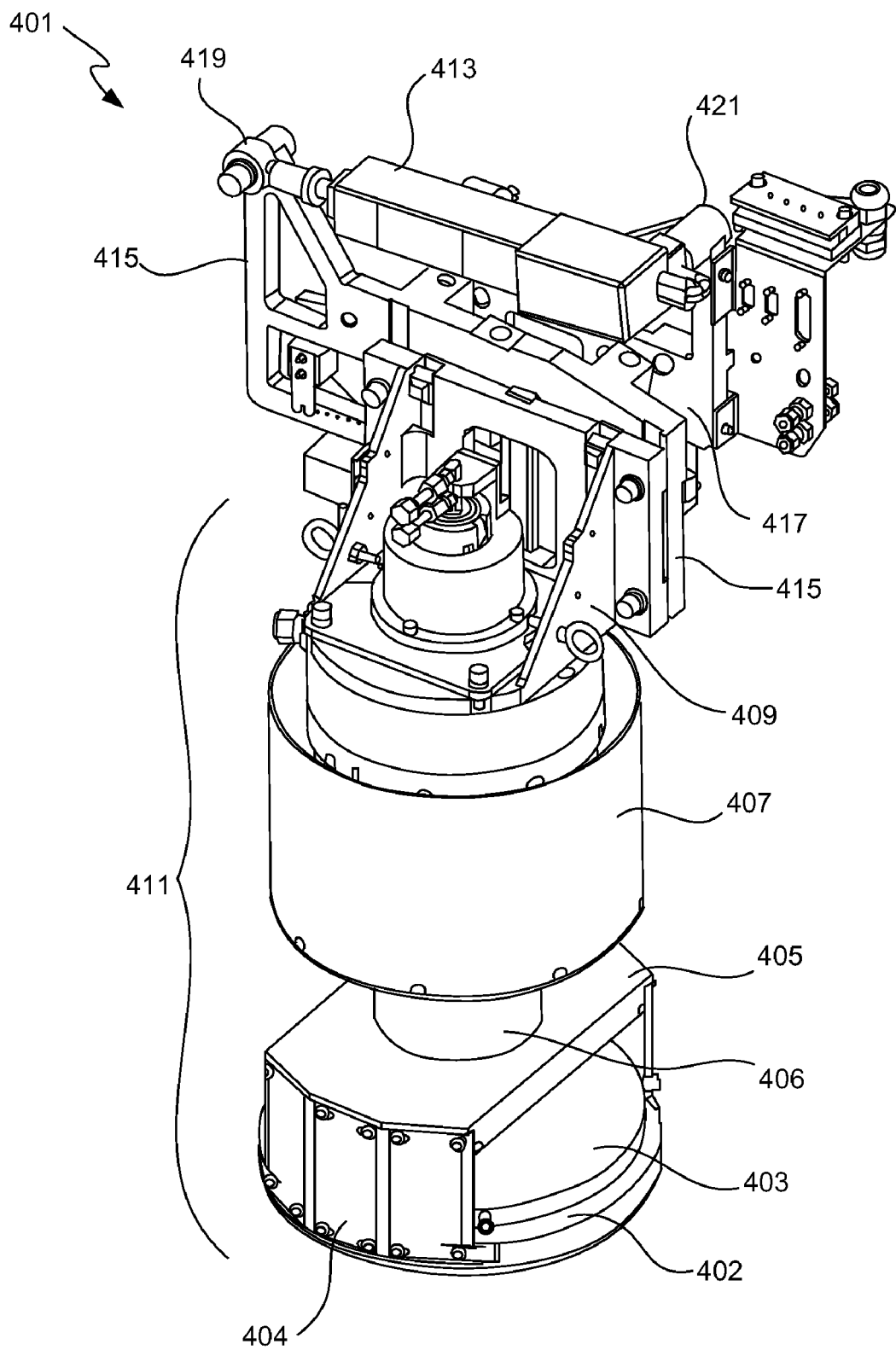
FIG. 4A depicts an apparatus of this invention for electrochemically treating semiconductor wafers.

FIG. 4A provides a perspective view of an improved clamshell apparatus, 401, for electrochemically treating semiconductor wafers. The actual clamshell comprises a cup 402, which holds a wafer, and a cone 403, which clamps the wafer securely in cup 402. Cup 402 is supported by struts 404, which are connected to a top plate 405. This assembly (402-405) is driven by a motor 407, via a spindle 406. Motor 407 is attached to a mounting bracket 409. For the purposes of this discussion, the assembly comprising components 402-409 is referred to as a wafer holder 411. Note however, that the concept of a "wafer holder" extends to various combinations of components that engage a wafer and allow its movement and positioning.

In this example, wafer holder 411 has a proximal end (nearest cup 402 and cone 403) and a distal end (nearest mounting bracket 409). Conventionally, mounting bracket 409 is used to mount wafer holder 411 to an actuator that moves the entire assembly vertically up and down to immerse the clamshell (proximal end) into a plating bath.

In accordance with this invention, mounting bracket 409 as depicted is fastened to a first plate 415 that is slidably connected to a second plate 417. A drive cylinder 413 is connected both to plate 415 and plate 417 at pivot joints 419 and 421, respectively. Thus, drive cylinder 413 (a first actuator) provides the force for sliding plate 415 (and thus wafer holder 411) across plate 417.

Figure 4C:
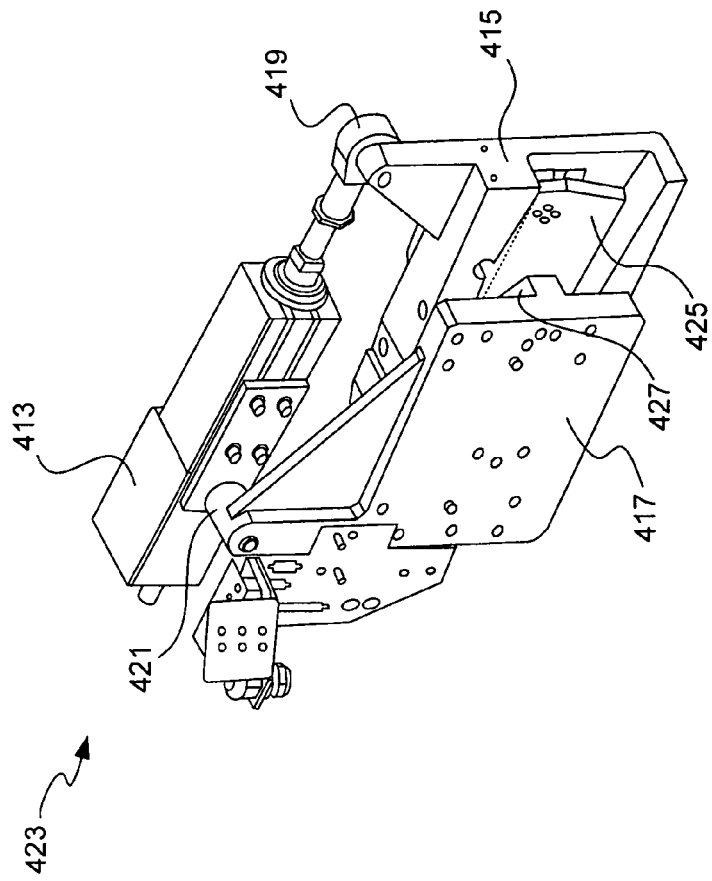
FIGS. 4B-C depict components of the apparatus shown in FIG. 4A.
Figure 4B:
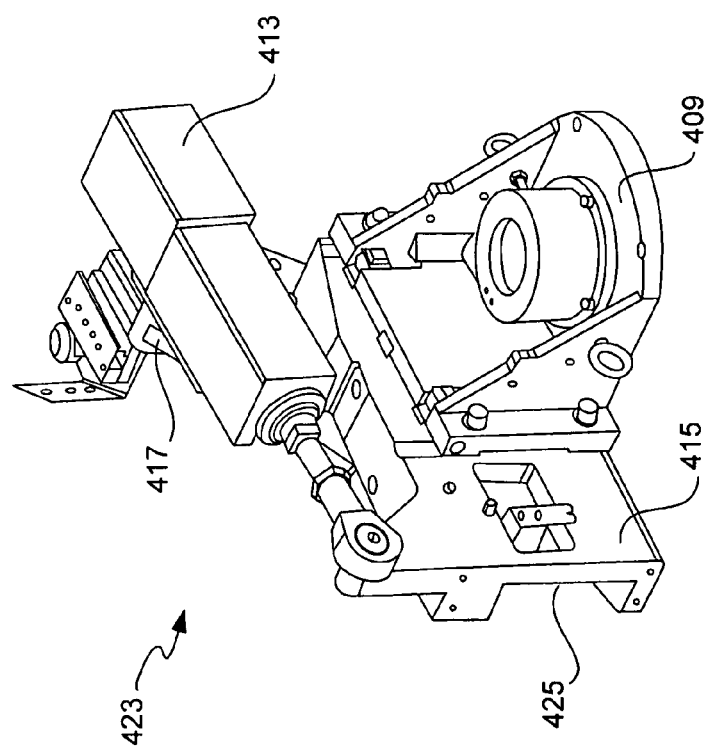

FIG. 4B provides a perspective view of assembly 423, comprising mounting bracket 409, plate 415, drive cylinder 413, and plate 417. Plate 415 contains a channel 425. Referring now to FIG. 4C, presenting a different perspective view of assembly 423, plate 417 can be more clearly seen. Plate 417 has integral to it an arced track 427, which fits within channel 425 of plate 415. Thus when drive cylinder 413 is actuated, plate 415 (and wafer holder 411 not shown) slides across plate 417 in an arced path. This provides the angle adjustment for the wafer holder. The distal end of wafer holder 411 (i.e. mounting bracket 409) is moved along an arced path, and thus the proximal end of wafer holder 411 (i.e. the clamshell holding the wafer) is tilted upon a virtual pivot. This assembly can be described as an inverted pendulum.

By analogy to FIGS. 3A-3D, drive cylinder 413 is a first actuator and plates 415 and 417 provide the arced track and coupling of wafer holder 411 to this drive mechanism. As mentioned, mounting bracket 409 is used conventionally to mount wafer holder 411 to an actuator that moves the entire assembly vertically up and down to immerse the clamshell (proximal end) into a plating bath. In this invention, plate 417 is used to mount wafer holder 411 to said actuator (a second actuator) that moves the entire assembly vertically up and down to immerse the clamshell (proximal end) into a plating bath. Thus, a two-component positioning apparatus provides both vertical movement along the Z-axis and a tilting movement along the X and Z-axes. Many existing clamshell electroplating apparatus do not have this capability. Because of the design of assembly 423, it can be provided as a retrofit for existing systems.

Embodiments of the present invention may employ various processes involving data stored in or transferred through one or more computer systems. Embodiments of the present invention also relate to the apparatus, such computers and microcontrollers, for performing these operations. These apparatus and processes may be employed to control the wafer positioning parameters of methods of the invention and apparatus designed to implement them. The control apparatus of this invention may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform and/or control the required method steps.

While this invention has been described in terms of a few preferred embodiments, it should not be limited to the specifics presented above. Many variations on the above-described preferred embodiments may be employed. Therefore, the invention should be broadly interpreted with reference to the following claims.

What is claimed is:

1. An apparatus for positioning a wafer relative to a plane defined by the surface of an electrolyte in an electroplating apparatus, the apparatus comprising:
    (a) a first movement assembly for moving the wafer into or out of the electrolyte along a trajectory substantially normal to the plane defined by the surface of the electrolyte; and
    (b) a second movement assembly, coupled to the first movement assembly, for adjusting the angle defined by the relative position of a planar plating surface of the wafer with respect to the plane defined by the surface of the electrolyte by tilting the wafer about a virtual pivot, while the virtual pivot is itself stationary or moving linearly along the trajectory substantially normal to the plane defined by the surface of the electrolyte.

2. The apparatus of claim 1, wherein the first and second movement assemblies can move the wafer concurrently to allow concurrent linear movement and tilting of the wafer.

3. The apparatus of claim 1, wherein the first and second movement assemblies can move the wafer at separate times.

4. The apparatus of claim 1, wherein the second movement assembly comprises an inverted pendulum.

5. The apparatus of claim 4, wherein the inverted pendulum comprises a longitudinal member configured to hold the wafer at a proximal end of the longitudinal member and configured to move the distal end of the longitudinal member over an arced path.

6. The apparatus of claim 5, wherein the inverted pendulum is integrated into the electroplating apparatus.

7. The apparatus of claim 6, wherein the electroplating apparatus is a clamshell electroplating apparatus.

* * * * *